(12) United States Patent
Wan et al.

(10) Patent No.: US 10,867,882 B2
(45) Date of Patent: *Dec. 15, 2020

(54) SEMICONDUCTOR PACKAGE, SEMICONDUCTOR DEVICE AND METHOD FOR PACKAGING SEMICONDUCTOR DEVICE

(71) Applicant: Taiwan Semiconductor Manufacturing Co., Ltd., Hsinchu (TW)

(72) Inventors: Albert Wan, Hsinchu (TW); Chao-Wen Shih, Hsinchu County (TW); Han-Ping Pu, Taichung (TW); Hsin-Yu Pan, Taipei (TW); Sen-Kuei Hsu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/693,386

(22) Filed: Nov. 25, 2019

(65) Prior Publication Data

US 2020/0091031 A1 Mar. 19, 2020

Related U.S. Application Data

(63) Continuation of application No. 16/016,656, filed on Jun. 25, 2018, now Pat. No. 10,490,479.

(51) Int. Cl.
*H01L 23/34* (2006.01)
*H01L 23/367* (2006.01)
(Continued)

(52) U.S. Cl.
CPC ...... *H01L 23/3675* (2013.01); *H01L 21/4853* (2013.01); *H01L 21/565* (2013.01); *H01L 21/568* (2013.01); *H01L 21/6835* (2013.01); *H01L 23/3128* (2013.01); *H01L 23/49816* (2013.01); *H01L 23/49838* (2013.01); *H01L 23/66* (2013.01); *H01L 24/20* (2013.01); *H01L 24/32* (2013.01); *H01L 24/73* (2013.01); *H01L 24/83* (2013.01); *H01Q 1/02* (2013.01); *H01Q 21/08* (2013.01); *H01L 2221/68345* (2013.01); *H01L 2221/68359* (2013.01); *H01L 2223/6605* (2013.01); *H01L 2223/6677* (2013.01);
(Continued)

(58) Field of Classification Search
CPC ..................................... H01L 23/66
See application file for complete search history.

(56) References Cited

U.S. PATENT DOCUMENTS 10,490,479 B1\* 11/2019 Wan ............... H01L 21/6835
2010/0283085 A1\* 11/2010 Bemanian ........... H01L 24/14
257/209

\* cited by examiner

*Primary Examiner* — Didarul A Mazumder
*Assistant Examiner* — Wasiul Haider
(74) *Attorney, Agent, or Firm* — JCIPRNET (57) ABSTRACT

A semiconductor package, a semiconductor device and a method for packaging the semiconductor device are provided. A semiconductor package includes a first conductive wire layer with a first mounting area and a second mounting area, an integrated circuit (IC), a radiation fin structure and an antenna. The first mounting area and the second mounting area do not overlap. The IC is disposed on a first surface of the first mounting area. The radiation fin structure is disposed on a second surface of the first mounting area. The antenna is disposed on the second mounting area.

20 Claims, 11 Drawing Sheets

(51) Int. Cl.
*H01L 23/66* (2006.01)
*H01L 23/00* (2006.01)
*H01L 21/56* (2006.01)
*H01L 21/48* (2006.01)
*H01L 23/31* (2006.01)
*H01L 23/498* (2006.01)
*H01L 21/683* (2006.01)
*H01Q 1/02* (2006.01)
*H01Q 21/08* (2006.01)

(52) U.S. Cl.
CPC .............. *H01L 2224/221* (2013.01); *H01L 2224/32225* (2013.01); *H01L 2224/73217* (2013.01); *H01L 2224/83005* (2013.01)

SEMICONDUCTOR PACKAGE, SEMICONDUCTOR DEVICE AND METHOD FOR PACKAGING SEMICONDUCTOR DEVICE

CROSS-REFERENCE

This application is a continuation application of and claims the priority benefits of U.S. patent application Ser. No. 16/016,656, filed on Jun. 25, 2018, now allowed. The entirety of the above-mentioned patent applications is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). Since passive components and chips which are packed in a semiconductor package generate heat while operating, heat dissipation for the semiconductor package is one of the major concerns in the semiconductor industry. However, a semiconductor package with heat dissipation structure is usually thickness overhead which would be an issue in the development of the semiconductor industry.

Therefore, there is a need to integrate heat dissipation structure in a semiconductor package and to reduce the thickness of the semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2I are schematic cross-sectional views illustrating a manufacturing method of a semiconductor package of the semiconductor device in FIG. 1.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
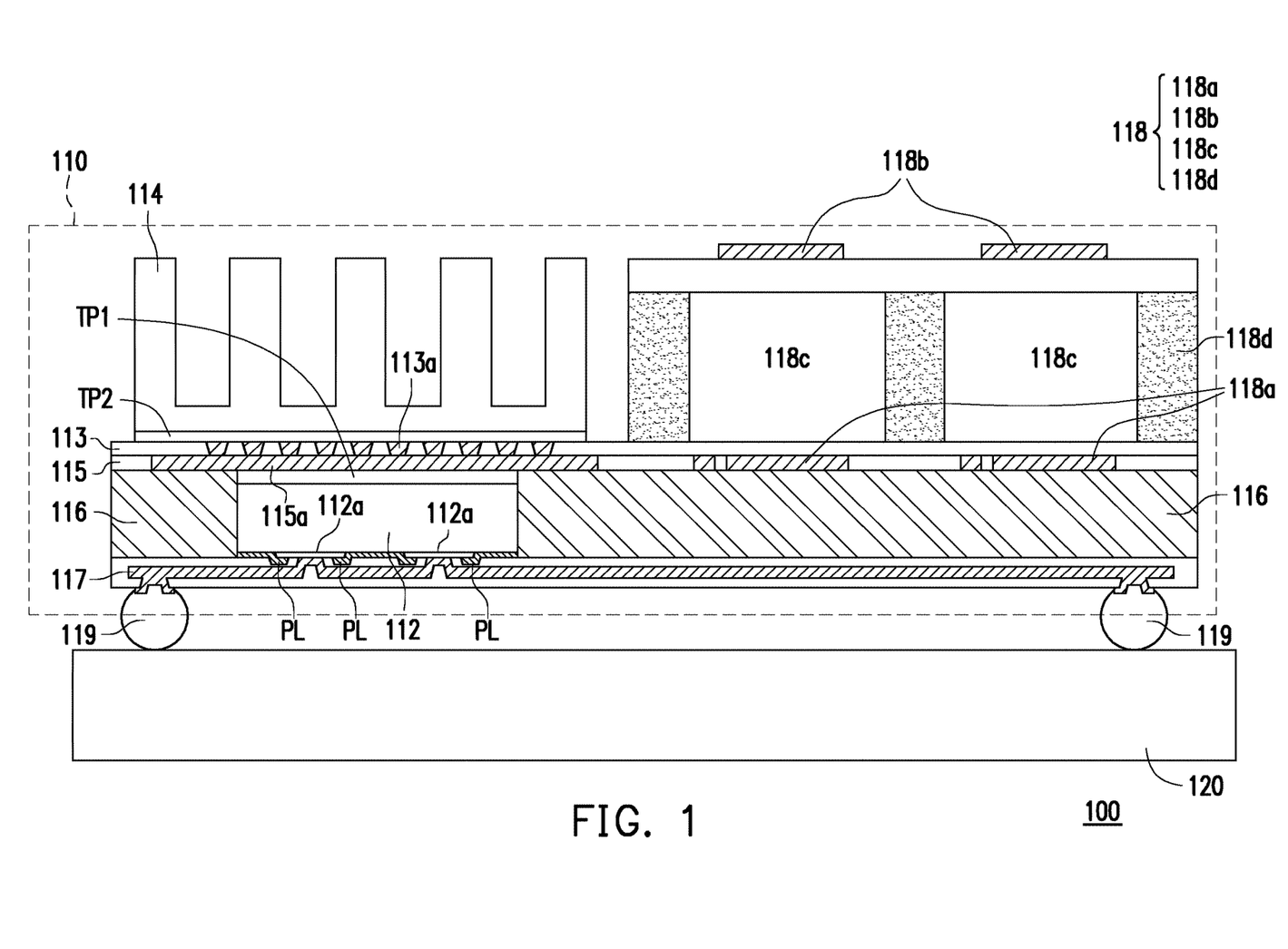
FIG. 1 is a schematic cross-sectional view of a semiconductor device in accordance with some embodiments of the disclosure.

FIG. 1 is a schematic cross-sectional view of a semiconductor device 100 in accordance with some embodiments of the disclosure. Referring to FIG. 1, the semiconductor device 100 includes a semiconductor package 110 and a printed circuit board 120. The semiconductor package 110 includes an integrated circuit (IC) 112, a heat dissipation structure 114, a molding layer 116 and an antenna 118. Additionally, the semiconductor package 110 may further include redistribution layers (RDLs) 113, 115 and 117, thermal paste layers TP1 and TP2, and the connecting components or solder balls 119. The semiconductor package 110 is mounted on the printed circuit board 120 through the solder balls 119. In some embodiments of the disclosure, the semiconductor package 110 may be an integrated fan-out (InFO) package which integrates the heat dissipation structure 114 to improve the heat dissipation capability of the InFO package.

In some embodiments of the disclosure, the IC 112 may be or include a radio-frequency (RF) chip which is configured to generate or process RF signals. The RF chip may be used in numerous electronic devices such as cellular telephones and wireless communication devices. The IC 112 has an active side AS and a back side BS, where the backside BS is coupled to the heat dissipation structure 114 through the RDLs 113, 115 and the thermal paste layers TP1 and TP2. As such, the heat generated by the IC 112 may be dissipated by the heat dissipation structure 114. The active side AS of the IC 112 is electrically coupled to the solder balls 119 through the RDL 117 to communicate with circuits in the printed circuit board 120.

The heat dissipation structure 114 is disposed on a surface of the RDL 113 with a thermal paste layer TP2 in between the heat dissipation structure 114 and the RDL 113. The heat dissipation structure 114 has a high coefficient of thermal expansion to increase the heat dissipation performance. The material of the heat dissipation structure 114 may be copper, copper compound, aluminum, aluminum compound, ceramic material or a combination thereof. The thermal conduction coefficients of copper and aluminum are about 389 W/m-K and 210 W/m-K, respectively. It should be noted that the material and the shape of the heat dissipation structure 114 are not limited in the disclosure.

To improve the thermal conductivity and thermal dissipation performance, the thermal paste is disposed between the heat dissipation structure 114 and the RDL 113 and between the RDL 115 and the IC 112. The thermal paste may be thermally conductive (e.g., high thermal conductivity) and electrically insulating (high electrical conductivity) compound. The material for the thermal paste is not limited in the disclosure.

In some embodiments of the disclosure, the antenna 118 may be a double-patch antenna which includes at least one antenna patch 118a and at least one antenna patch 118b. The antenna patch 118a is separated from the antenna patch 118b by at least one dielectric layer, and the at least one dielectric layer may include at least one air cavity 118c for improving the performance of the antenna 118. In some embodiments, the supporting frame 118d is used to form the air cavity 118c. However, the dielectric layer with air cavity 118c should not be limited to the disclosure. The at least one dielectric layer may be filled up with other dielectric material instead of the air, and the antenna design may be adapted according to the design needs. The antenna 118 may further include a ground plane which may be the RDL 117 in an embodiment of the disclosure.

In some embodiments, the materials of the antenna patches 118a and 118b may be different from the material of the heat dissipation structure 114 to avoid the signal interferences between the heat dissipation structure 114 and the antenna 118. The antenna 118 may be separated from the heat dissipation structure 114 by a gap (e.g., an air gap) to reduce the influence of the heat from the heat dissipation structure 114 to the performance of the antenna 118. The materials for the antenna patches 118a, 118b and the heat dissipation structure 114, and the width of the air gap between the antenna 118 and the heat dissipation structure 114 are selected according to designed needs.

The antenna 118 is disposed on the RDL 113 and is arranged in side-by-side with the heat dissipation structure 114. In this way, the thickness of the semiconductor package 110 is reduced while the performance of the antenna 118 and the heat dissipation structure is improved.

The molding layer 116 may be served as a protective layer that protect the IC 212 and other components of the semiconductor package 110. In addition, the molding layer 116 may also be served as a part of the antenna 118. For example, the RDL 117 may serve as a ground plane of the antenna 118, and the molding layer 116 may serve as a dielectric layer which separate the ground plane from the antenna patch 118a.

Figure 2A:
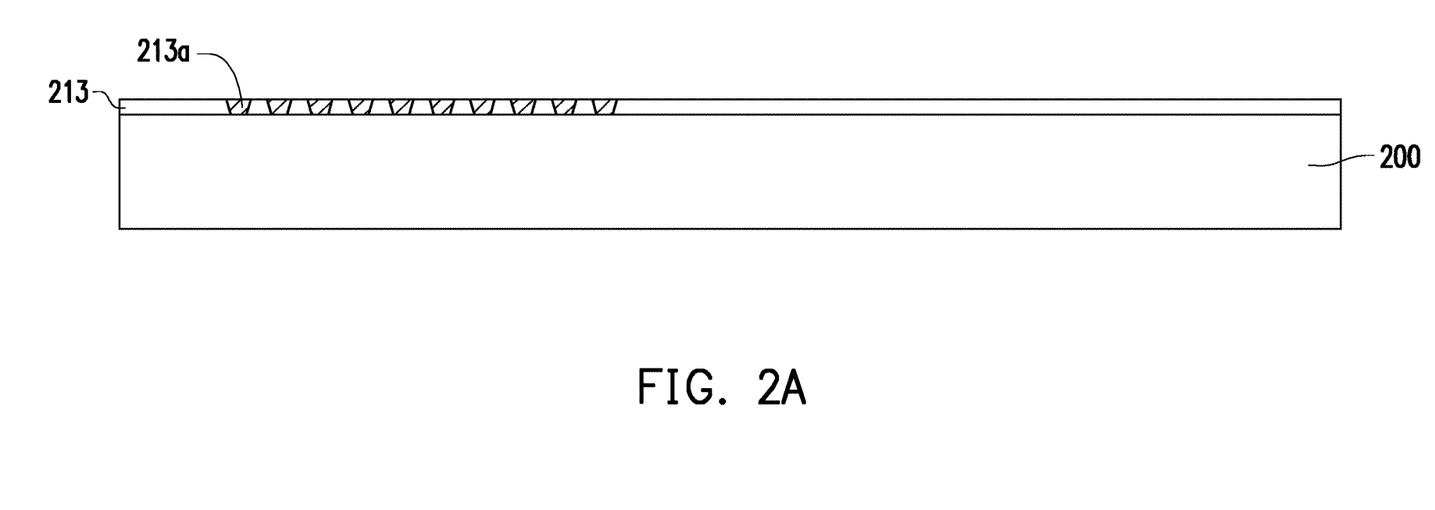

FIG. 2A to FIG. 2I are schematic cross-sectional views illustrating a manufacturing method of a semiconductor package according to some embodiments of the disclosure. Referring to FIG. 2A, a RDL 213 is formed on a carrier substrate 200. The carrier substrate 200 may be a glass substrate or a glass supporting board. Alternatively, other suitable materials may be adapted for the carrier substrate 200 as long as the materials are able to withstand the subsequent manufacturing processes and support the elements formed thereon.

In some embodiments of the disclosure, an adhesive layer (not shown) is formed between the carrier substrate 200 and the RDL 213 to enhance the adhesion between the carrier substrate 200 and the other structures subsequently formed thereon, and to improve the rigidity of the overall package structure during the manufacturing process. In some embodiments, the adhesive layer may be a light-to-heat-conversion (LTHC) adhesive layer, and such layer enables room temperature de-bonding from the carrier substrate by applying laser irradiation.

The RDL 213 is formed on the carrier substrate 200 or on the adhesive layer (not shown) on the surface of the carrier substrate 200. In some embodiments, the RDL 213 includes conductive portions (or conductive via) 213a which penetrates through the RDL 213. The conductive portions 213a may be formed by a plating process or a photomask process or any other suitable processes. The conductive portions 213a may include copper, aluminum, gold, silver, tin, or a compound including at least one of them.

Figure 2B:
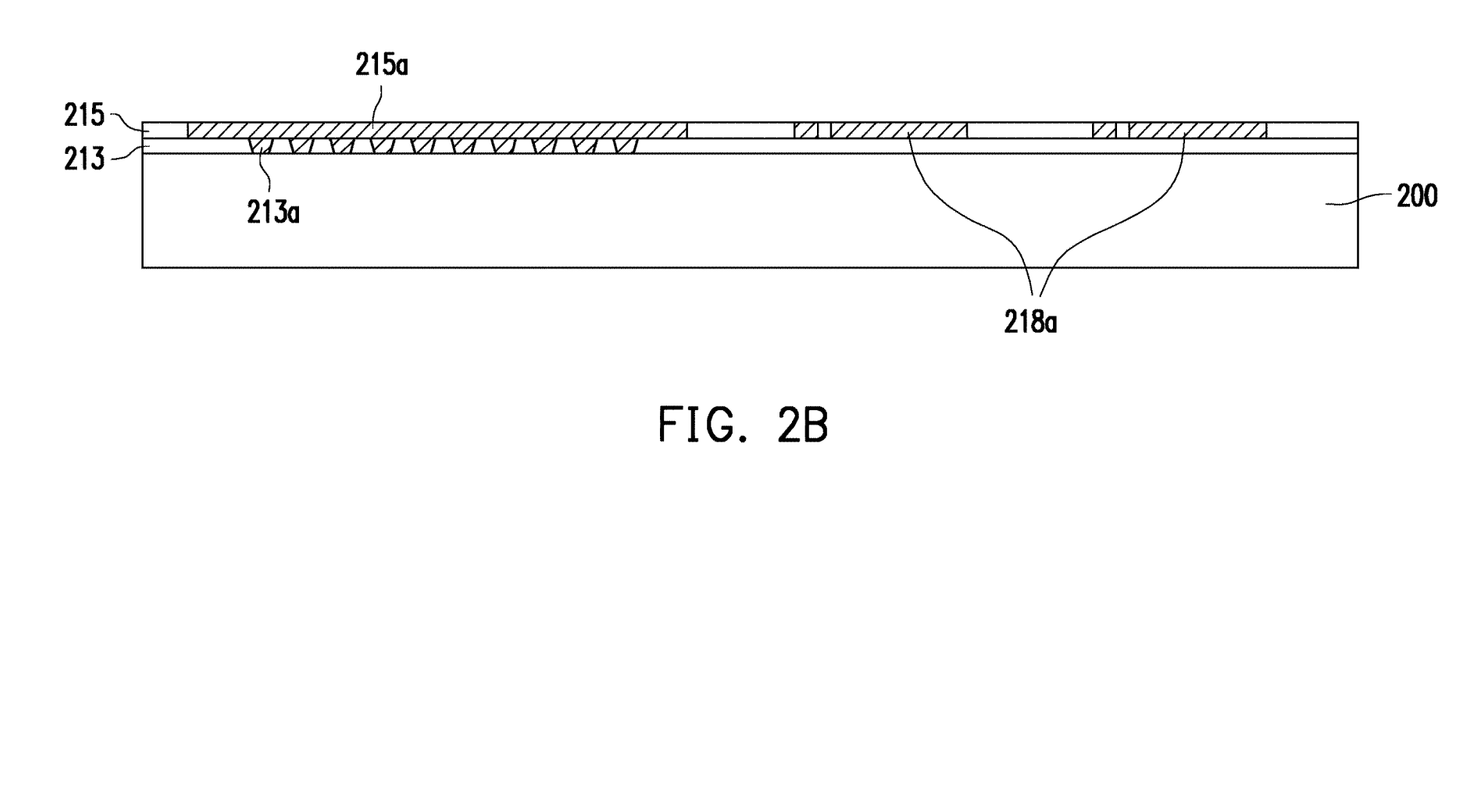

Referring to FIG. 2B, after forming the RDL 213 on the carrier substrate 200, the RDL 215 are formed on the RDL 213. The RDL 215 may include antenna patches 218a and a conductive portion 215a which serves as a chip-placement area. The antenna patches 218a and the chip-placement area 215a are made of conductive materials such as copper, aluminum, gold, silver, tin, or a compound including at least one of them. The conductive materials of the antenna patches 218a may be the same or different from the chip-placement area 215a, and the conductive materials of the RDL 215 may be the same or different from the materials of the RDL 213. The RDL 213 and RDL 215 in FIG. 2A to 2I may be the same as the RDL 113 and RDL 115, respectively shown in FIG. 1.

The conductive portion 215a of the RDL 215 may directly contact to the conductive portion 213a of the RDL 213. The techniques for forming the RDL 215 are not limited in the present disclosure.

Figure 2C:
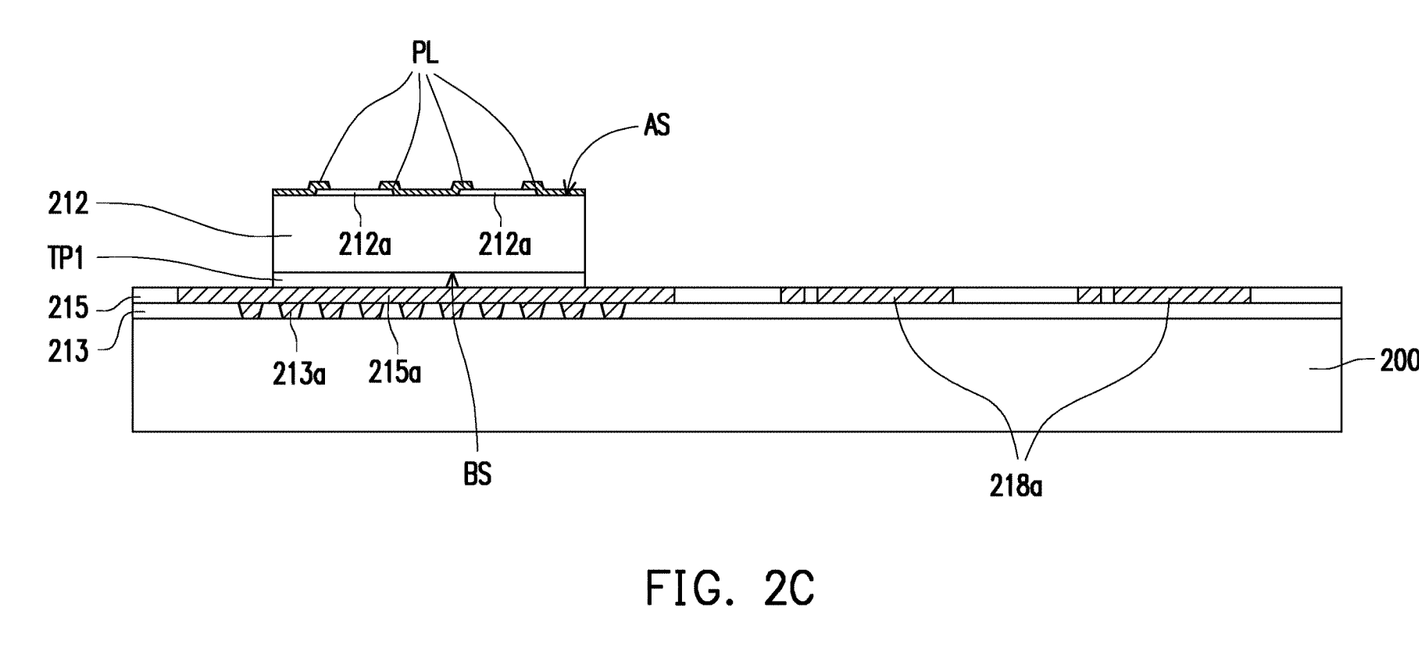

Referring to FIG. 2C, the IC 212 is mounted on the conductive portion 215a of the RDL 215. The IC 212 may have an active side AS and a back side BS, where the back side BS is mounted on the conductive portion 215a of the RDL 215. In some embodiments of the disclosure, the back side BS of the IC 212 is mounted on the RDL 215 through a thermal paste layer TP1 disposed between the IC 212 and the RDL 215. The thermal paste layer TP1 includes thermal paste that is configured to improve the thermal conductivity between the IC 212 and the RDL 215, thereby improving the heat dissipation efficiency.

The active side AS of the IC 212 may have at least one connecting terminal or connecting pad 212a for electrically connecting the IC 212 with other circuits. At least one passivation layer PL may be formed on the active side AS of the IC 212, where the at least one passivation layer PL has at least one opening that expose the connecting pad 212a of the IC 212. The passivation layer PL may be formed on the IC 212 before mounting the IC 212 to the RDL 215 or after mounting the IC 212 to the RDL 215. The IC 212 shown in FIG. 2A to 2I may be the same as the IC 112 shown in FIG. 1.

Figure 2D:
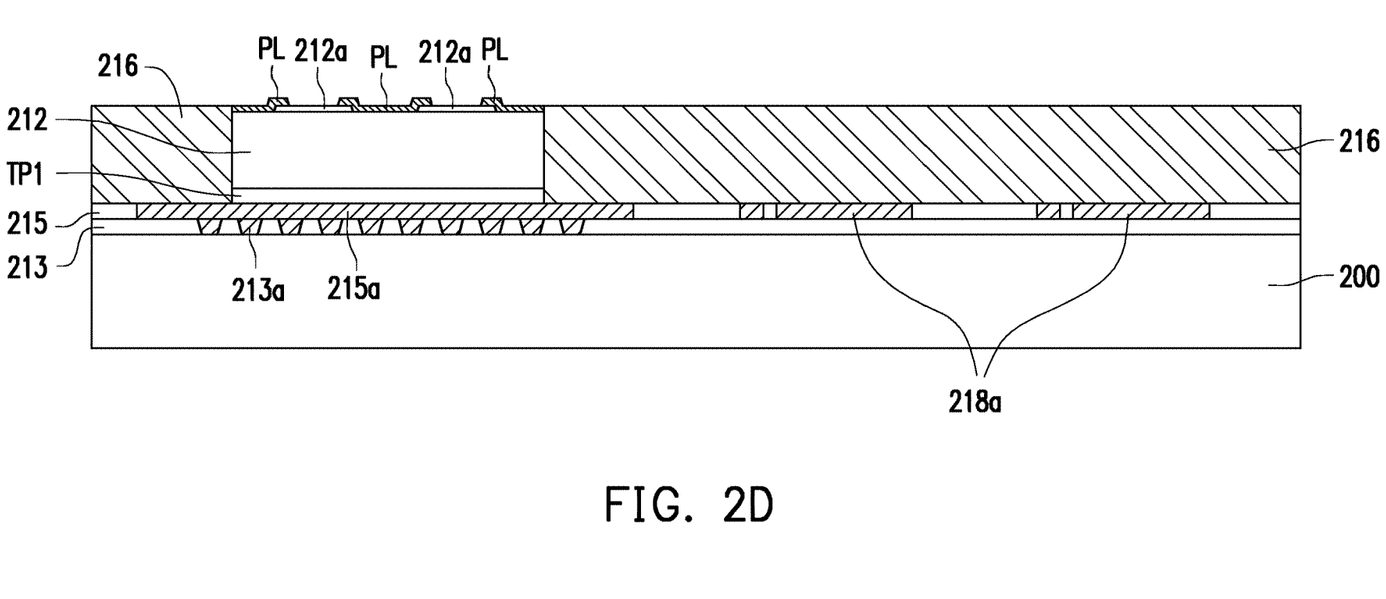

Referring to FIG. 2D, a molding process is performed to form a molding layer 216 over the RDL 215. The molding layer 216 may be the same as the molding layer 116 shown in FIG. 1. The molding layer 216 has molding compound that may be a protective resin such as, for example, an epoxy, polyimide or other dielectric composition. It should be noted that the molding compound is only provided on the area of the RDL 215 where the IC 212 is not occupied. In other words, the active side AS of the IC 212 is not encapsulated by the molding compound, but is exposed for further processing. In some embodiments of the disclosure, the thickness of the molding layer is substantially equal to the thickness of the IC 212, but the disclosure is not limited thereto.

Figure 2E:
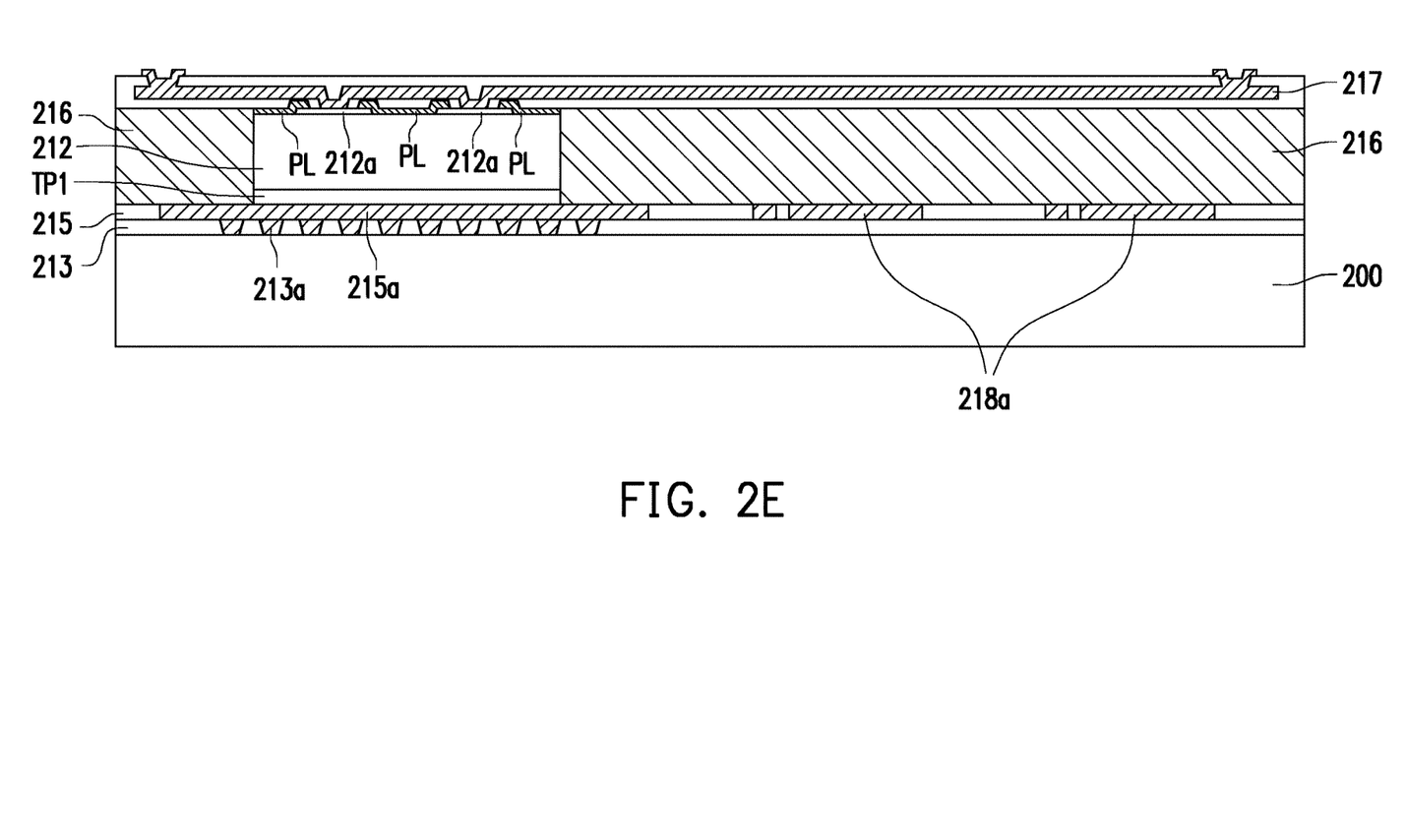

Referring to FIG. 2E, the RDL 217 is formed on the molding layer 216 and the IC 212. The RDL 217 is electrically coupled to the IC 212 through the connecting pad 212a of the IC 212. The IC 212 may be coupled to other circuits outside the semiconductor package through the RDL 217. The RDL 217 may include a plurality of conductive pads (not shown). The conductive pads are for example, under-ball metallurgy (UBM) patterns used for ball mount. In some other embodiments, the conductive pads (UBM patterns) are omitted.

Figure 2F:
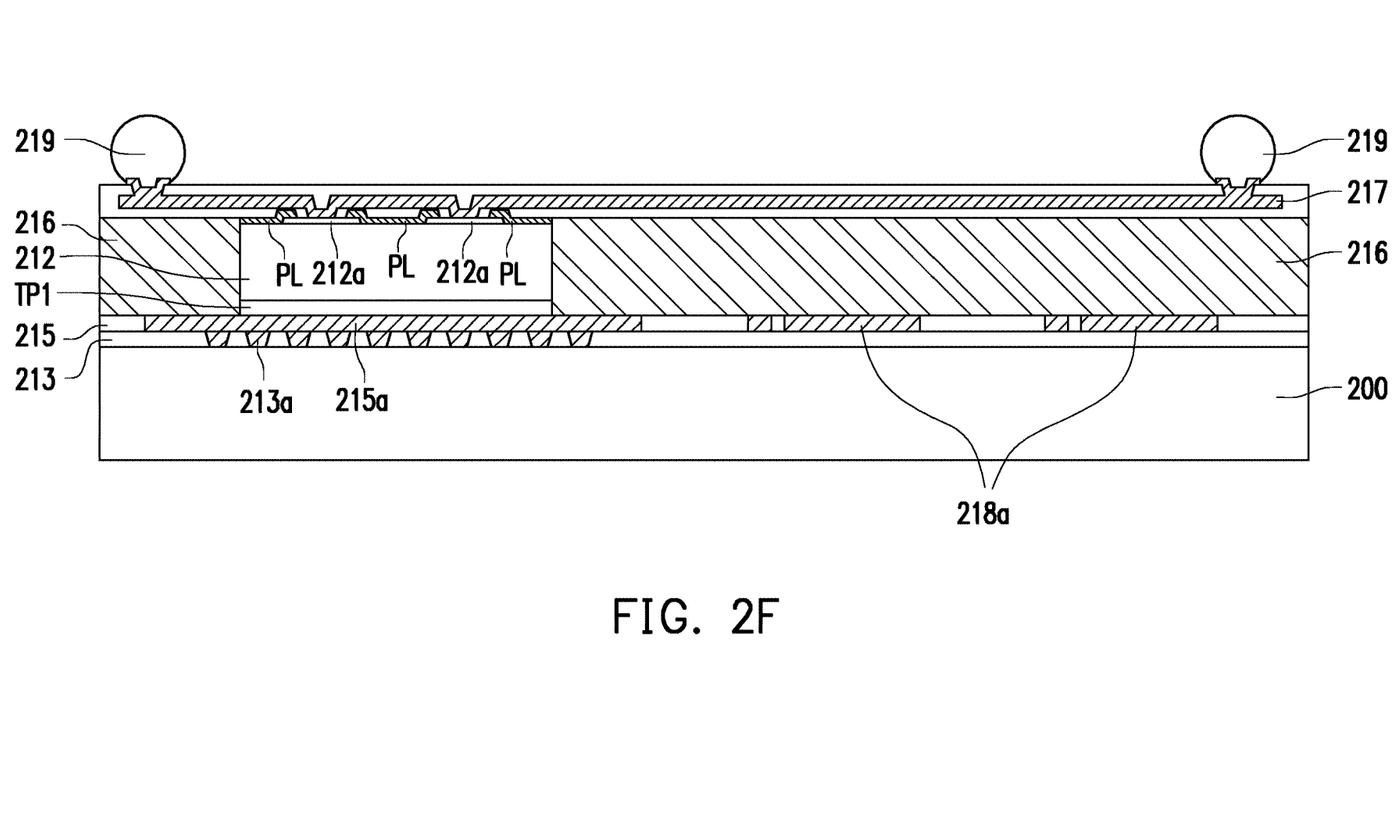

Referring to FIG. 2F, the solder balls 219 are mounted to the RDL 217 so that the IC 212 is electrically coupled to the solder balls 219 through the RDL 217. The RDL 217 and the solder balls 219 shown in FIG. 2 may be the same as the RDL 117 and the solder balls 119, respectively shown in FIG. 1.

Figure 2G:
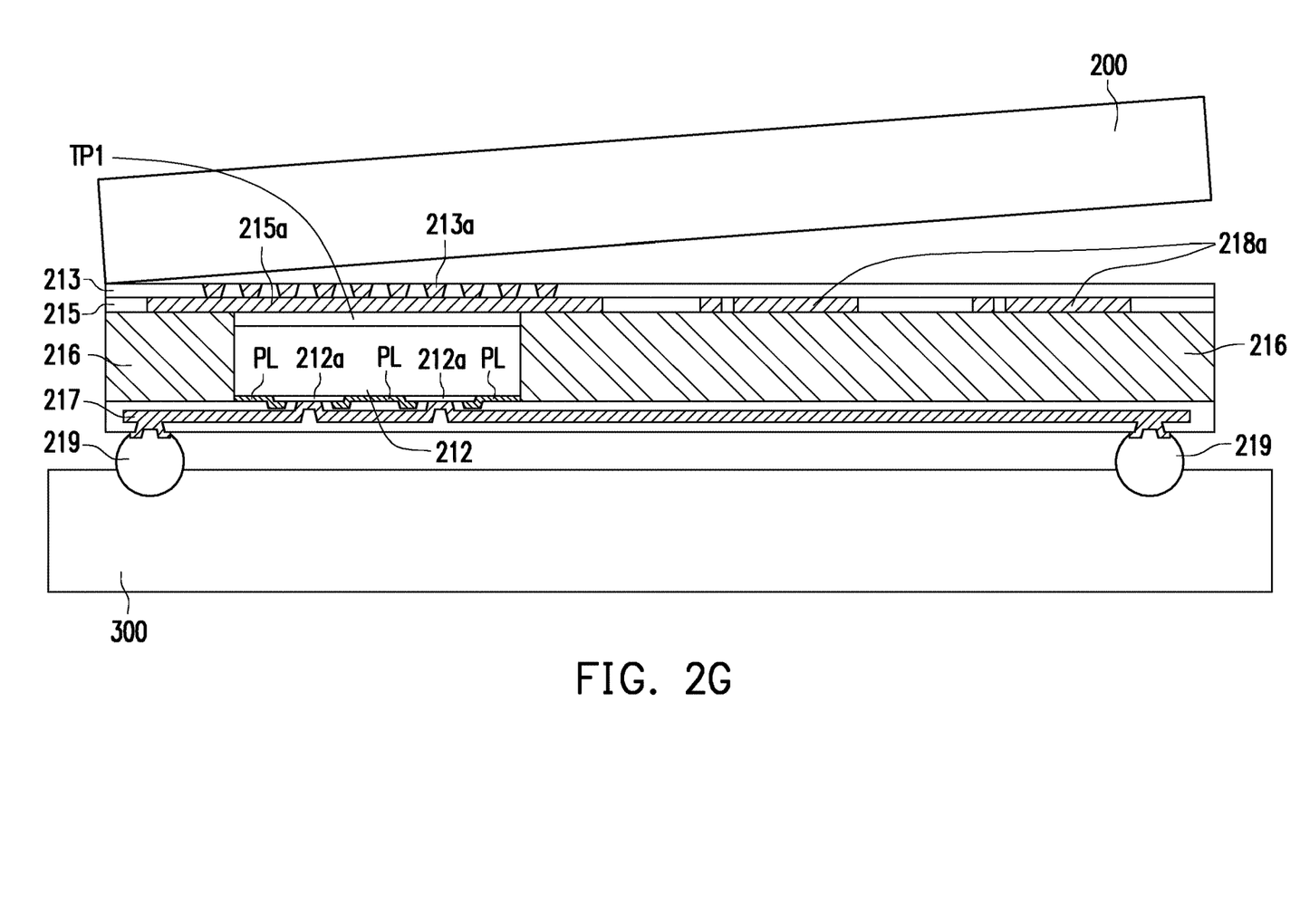

Referring to FIG. 2G, the semiconductor package is flipped over (or turned up side down) and is placed on a tape 300, where the solder balls 219 contact the tape 300. The tape 300 may be formed of a material which withstands the subsequent processes. The tape 300 is detachable, and the tape 300 is removed from the semiconductor package after the completion of manufacturing process.

As shown in FIG. 2G, the carrier substrate 200 is de-bonded from the semiconductor package to expose the RDL 213. In an embodiment where the adhesive layer is formed between the carrier substrate 200 and the RDL 213, the carrier substrate 200 may be de-bonded by using laser irradiation.

Figure 2H:
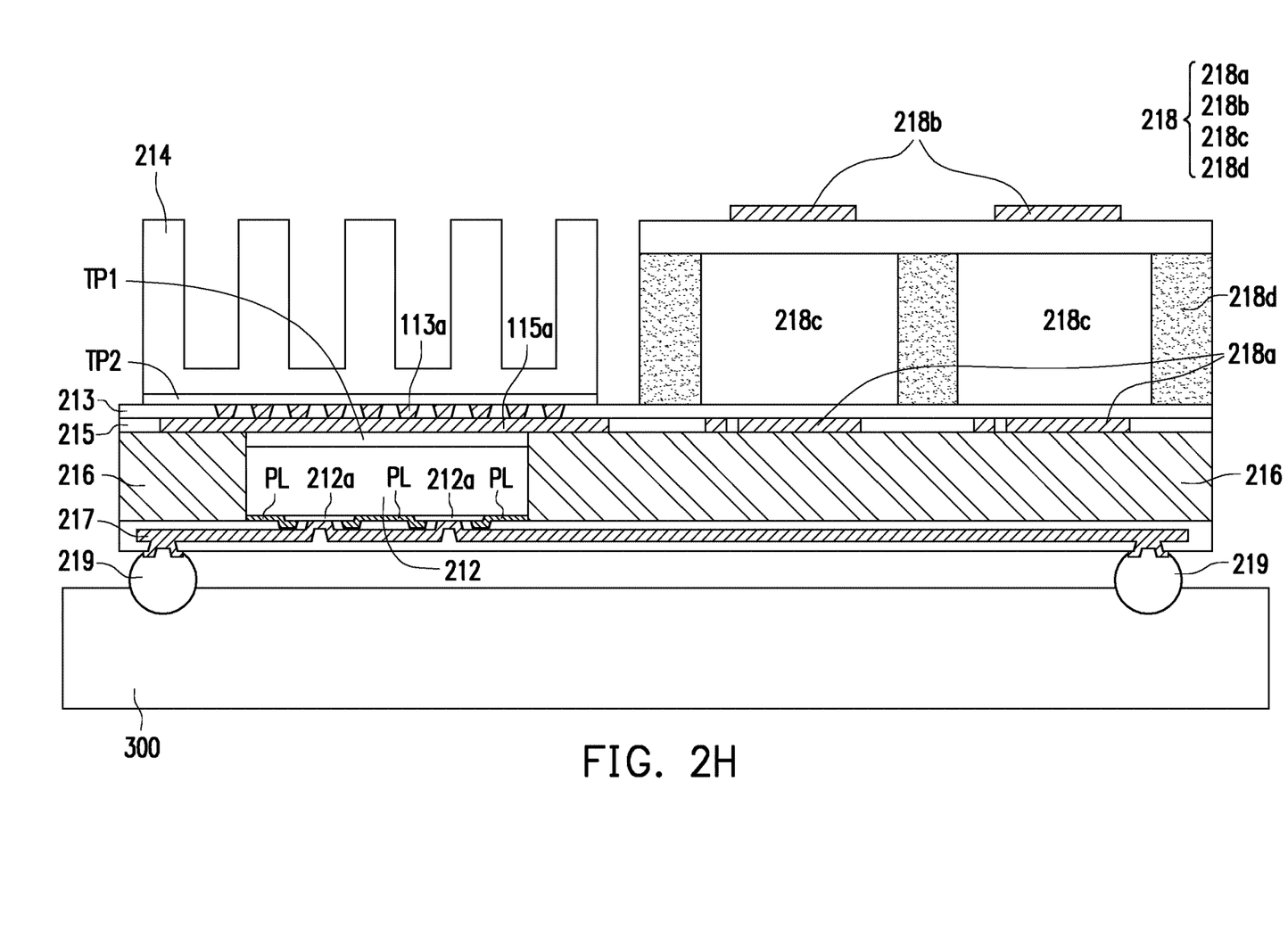

Referring to FIG. 2H, the heat dissipation structure 214 is mounted on the exposed surface of the RDL 213. In some embodiments of the disclosure, the heat dissipation structure 214 is mounted on the RDL 213 through a thermal paste layer TP2 which is disposed between the heat dissipation structure 214 and the RDL 213. The materials of the thermal paste layer TP2 may be the same as or different from the material of the thermal paste layer TP1. The thermal paste layers TP1, TP2 and the RDLs 213 and 215 forms a thermal dissipation path between the IC 212 and the heat dissipation structure 214. As such, heat generated by the IC 212 is transferred to the heat dissipation structure 214 via the formed thermal path, and is dissipated by the heat dissipation structure 214. In some embodiments, the heat generated by the IC 212 may be dissipated through structure 214 to an external heat dissipation structure of a device. For example, the external heat dissipation structure may be a LCD shield plate in the device, but the disclosure is not limited thereto. The device may include stationary and mobile computing devices such as mobile phone, cameras, television sets, and the like. It should be noted that the shape of the heat dissipation structure 214 as shown in FIG. 2H is for illustration purpose only, any shape and structure of heat dissipation structure falls within the scope of the disclosure. The heat dissipation structure 214 may be the same as the heat dissipation structure 114 shown in FIG. 1.

In FIG. 2H, the antenna 218 is arranged side-by-side with the heat dissipation structure 214. The antenna 218 may include at least one antenna patch 218a, at least one antenna patch 218b, a dielectric layer that is formed by at least one air cavity 218c and a supporting frame 218d. In the example shown in FIG. 2H, the cavity 218c is the air cavity, but the disclosure is not limited thereto. The material to fill up the cavity 218c may be selected according to the designed requirements.

In some embodiments of the disclosure, the air cavity 218c may be formed by performing a chemical etching or physical cutting or any other suitable process which is capable of generating the air cavity between antenna patches. The antenna 218 as shown in FIG. 2A to 2I may be the same as the antenna 118 shown in FIG. 1.

Figure 2I:
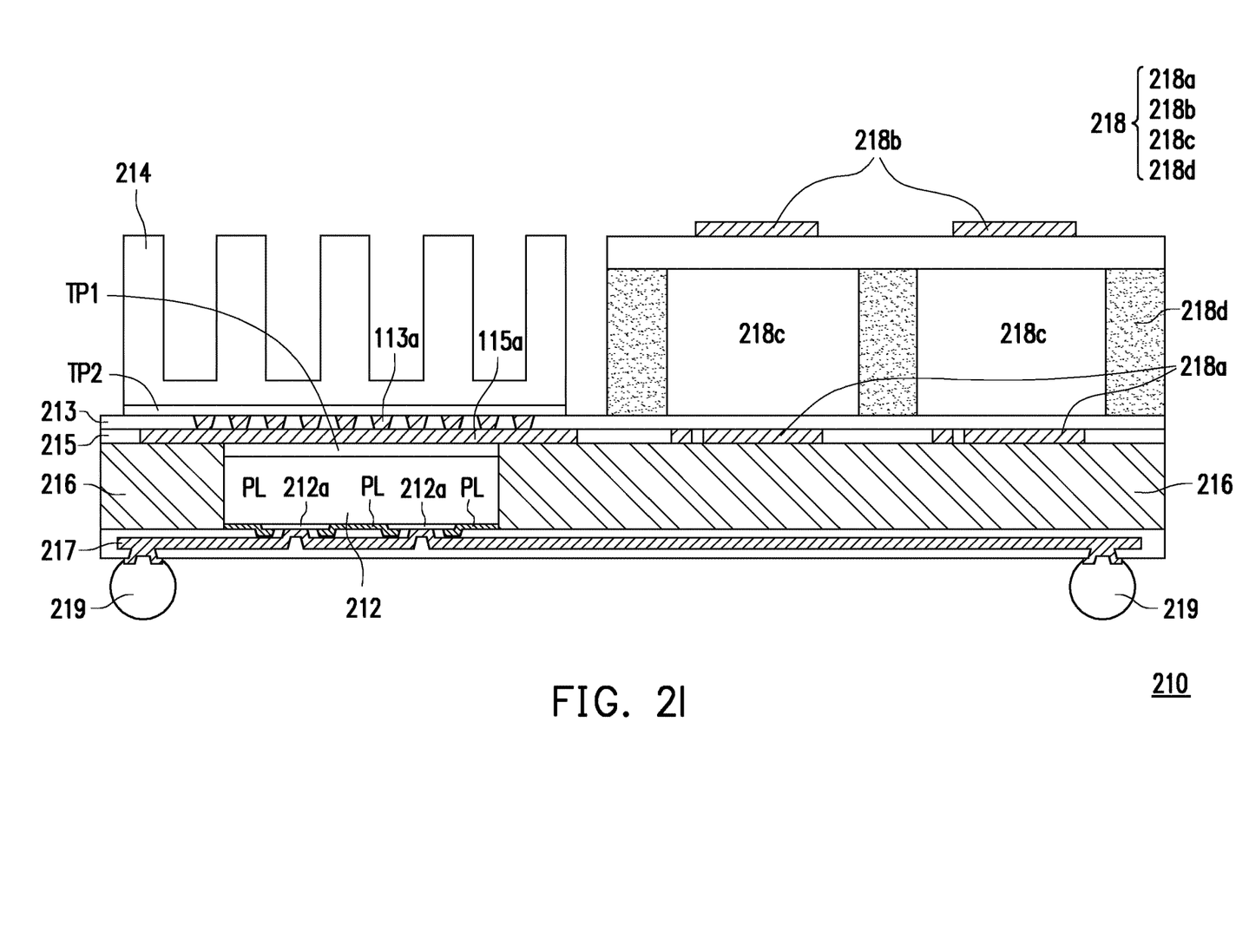

In FIG. 2I, the tape 300 is removed to get the semiconductor package 210.

Figure 3:
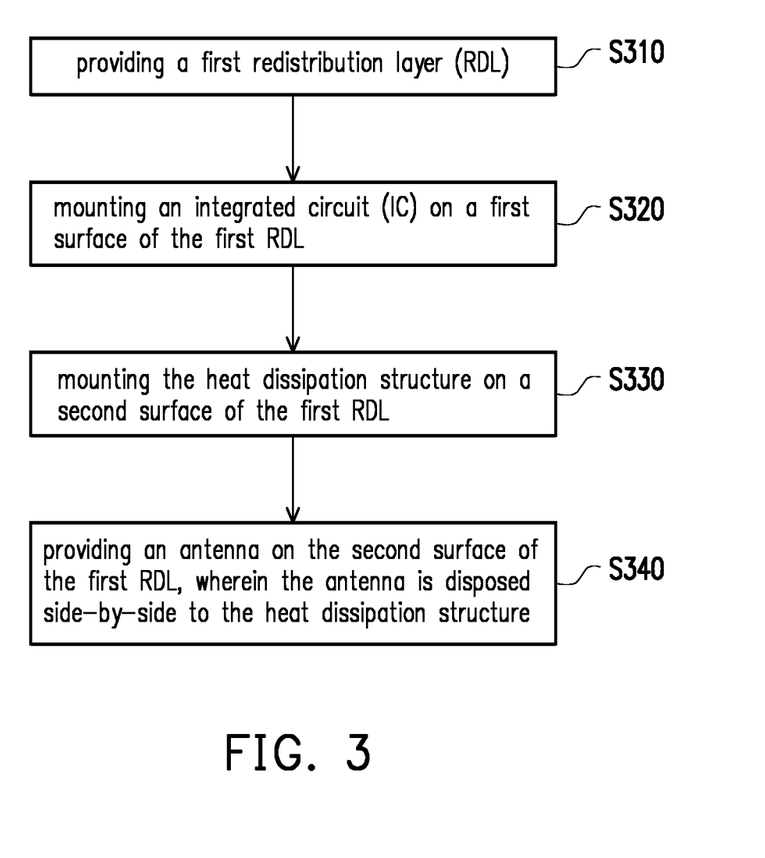
FIG. 3 is a schematic flowchart indicating the manufacturing method of a semiconductor package in accordance with some embodiments of the disclosure.

FIG. 3 is a schematic flowchart indicating the manufacturing method of a semiconductor package in accordance with some embodiments of the disclosure. In step S310, a first redistribution layer (RDL) is provided on a carrier substrate. Step S310 is illustrated in FIG. 2B of the disclosure and is described above, thus the detailed description about step S310 is omitted herein.

In step S320, an integrated circuit (IC) is mounted on a first surface of the first RDL. The steps S320 is illustrated in FIG. 2C of the disclosure and is described above, thus the detailed description about step S320 is omitted herein.

In step S330, the heat dissipation structure is mounted on a second surface of the first RDL; and in step S340, an antenna is provided on the second surface of the first RDL, wherein the antenna is disposed side-by-side to the heat dissipation structure. The steps S330 and S340 are illustrated in FIG. 2D and FIG. 2H, and are described above, thus the detailed description about steps S330 and S340 are omitted herein.

In accordance with some embodiments of the disclosure, a semiconductor package includes an integrated circuit (IC), a heat dissipation structure, a molding compound, and an antenna. The IC is mounted on a first surface of a first redistribution layer (RDL). The heat dissipation structure is mounted on a second surface of the first RDL. The antenna is disposed on the second surface of the first RDL, wherein the antenna is disposed side-by-side to the heat dissipation structure.

In accordance with some embodiments of the disclosure, a semiconductor device includes a semiconductor package and a printed circuit board. The semiconductor package includes an integrated circuit (IC), a heat dissipation structure, and an antenna. The IC is mounted on a first surface of a first redistribution layer (RDL). The heat dissipation structure is mounted on a second surface of the first RDL. The antenna is disposed on the second surface of the first RDL, wherein the antenna is disposed side-by-side to the heat dissipation structure. The printed circuit board is connected to the semiconductor package by at least one solder ball.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first conductive wire layer with a first mounting area and a second mounting area, wherein the first mounting area and the second mounting area do not overlap;
   an integrated circuit (IC) disposed on a first surface of the first mounting area, wherein the IC is electrically insulated from the first conductive wire layer;
   a radiation fin structure, disposed on a second surface of the first mounting area; and
   an antenna, disposed on the second mounting area.

2. The semiconductor package of claim 1, wherein the antenna is disposed on a surface of the second mounting area, and the second surface of the first mounting area and the surface of the second mounting area are in the same plane.

3. The semiconductor package of claim 1, wherein the antenna is disposed side-by-side to the heat dissipation structure.

4. The semiconductor package of claim 1, further comprising:
a first thermal paste layer, disposed between the IC and the second surface of the first conductive wire layer to form a heat dissipation path from the IC to the radiation fin structure through the first conductive wire layer, wherein the first thermal paste layer is formed by thermally conductive and electrically insulated material.

5. The semiconductor package of claim 1, wherein the antenna comprises at least one first antenna patch, and the at least one first antenna patch is formed in the first conductive wire layer.

6. The semiconductor package of claim 1, further comprising:
a dielectric layer, formed on the second surface of the first conductive wire layer; and
at least one second antenna patch of the antenna, formed on the dielectric layer.

7. The semiconductor package of claim 6, wherein the dielectric layer comprises an air cavity that is disposed side-by-side to the heat dissipation structure.

8. The semiconductor package of claim 1, further comprising:
a second conductive wire layer, disposed between a substrate and the first conductive wire layer, wherein the second conductive wire layer contacts the first conductive wire layer, and the radiation fin structure is mounted to the second surface of the first conductive wire layer through the second conductive wire layer.

9. The semiconductor package of claim 1, further comprising:
a second thermal paste layer, disposed between the heat dissipation structure and a second conductive wire layer.

10. The semiconductor package of claim 1, further comprising:
a molding layer, disposed over the first surface of the first conductive wire layer;
a third conductive wire layer, disposed on the molding layer and the IC; and
at least one solder ball, disposed on the third conductive wire layer to electrically connect to the IC with the at least one clout solder ball through the third conductive wire layer.

11. The semiconductor package of claim 1, wherein the first conductive wire layer is a redistribution layer.

12. A semiconductor device, comprising:
a semiconductor package, comprising:
a first conductive wire layer with a first mounting area and a second mounting area, wherein the first mounting area and the second mounting area do not overlapped;
an integrated circuit (IC) disposed on a first surface of the first mounting area, wherein the IC is electrically insulated from the first conductive wire layer;
a radiation fin structure, disposed on a second surface of the first mounting area; and
an antenna, disposed on the second mounting area; and
a printed circuit board, connected to the semiconductor package by at least one solder ball.

13. The semiconductor device of claim 12, wherein the antenna is disposed on a surface of the second mounting area, and the second surface of the first mounting area and the surface of the second mounting area are in the same plane.

14. The semiconductor device of claim 12, wherein the antenna is disposed side-by-side to the heat dissipation structure.

15. The semiconductor device of claim 12, further comprising:
a first thermal paste layer, disposed between the IC and the second surface of the first conductive wire layer to form a heat dissipation path from the IC to the radiation fin structure through the first conductive wire layer, wherein the first thermal paste layer is formed by thermally conductive and electrically insulated material.

16. The semiconductor device of claim 12, wherein the antenna comprises at least one first antenna patch, and the at least one first antenna patch is formed in the first conductive wire layer.

17. The semiconductor device of claim 12, further comprising:
a dielectric layer, formed on the second surface of the first conductive wire layer; and
at least one second antenna patch of the antenna, formed on the dielectric layer.

18. The semiconductor device of claim 17, wherein the dielectric layer comprises an air cavity that is disposed side-by-side to the heat dissipation structure.

19. The semiconductor device of claim 12, further comprising:
a second conductive wire layer, disposed between a substrate and the first conductive wire layer, wherein the second conductive wire layer contacts the first conductive wire layer, and the radiation fin structure is mounted to the second surface of the first conductive wire layer through the second conductive wire layer.

20. A method for packaging a semiconductor device, comprising:
providing a first conductive wire layer with a first mounting area and a second mounting area, wherein the first mounting area and the second mounting area do not overlapped;
disposing an integrated circuit (IC) on a first surface of the first mounting area, wherein the IC is electrically insulated from the first conductive wire layer;
disposing a radiation fin structure on a second surface of the first mounting area; and
providing an antenna on the second mounting area.

\* \* \* \* \*